US007061737B2

(12) United States Patent
Chen

(10) Patent No.: US 7,061,737 B2
(45) Date of Patent: Jun. 13, 2006

(54) SYSTEM AND METHOD FOR ESD PROTECTION ON HIGH VOLTAGE I/O CIRCUITS TRIGGERED BY A DIODE STRING

(75) Inventor: Chung-Hui Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 208 days.

(21) Appl. No.: 10/818,052

(22) Filed: Apr. 5, 2004

(65) Prior Publication Data

US 2005/0219782 A1 Oct. 6, 2005

(51) Int. Cl.
*H02H 3/20* (2006.01)
*H02H 9/04* (2006.01)

(52) U.S. Cl. ......................... 361/91.1; 361/56; 361/111

(58) Field of Classification Search ................. 361/56, 361/91.1, 111

See application file for complete search history.

(56) References Cited

U.S. PATENT DOCUMENTS

| | | | | |
|---|---|---|---|---|
| 5,413,969 A | | 5/1995 | Huang | 437/200 |
| 5,946,573 A | | 8/1999 | Hsu | 438/275 |
| 6,096,609 A | | 8/2000 | Kim et al. | 438/281 |
| 6,469,560 B1 | * | 10/2002 | Chang et al. | 327/310 |
| 6,479,870 B1 | | 11/2002 | Chen et al. | 257/355 |
| 6,690,561 B1 | * | 2/2004 | Hung et al. | 361/111 |
| 6,747,861 B1 | * | 6/2004 | Ker et al. | 361/111 |
| 6,765,771 B1 | * | 7/2004 | Ker et al. | 361/56 |

OTHER PUBLICATIONS

Ker, Ming-Dou et al., "Capacitor-Couple ESD Protection Circuit for Deep-Submicron Low-Voltage CMOS ASIC", IEEE Transactions on Very Large Scale Integration (VLSI) Systems, vol. 4, No. 3, (Sept. 1996), pp. 307-321.

Ker, Ming-Dou et al., "Complementary-SCR ESD Protection Circuit with Interdigitated Finger-Type Layout for Input Pads of Submicron CMOS IC's", IEEE Transactions on Electron Devices, vol. 42, No. 7, (Jul. 1995), pp. 1297-1304.

Wu et al., A New On-Chip ESD Protection Circuit with Dual Parasitic SCR Structures for CMOS VLSI, IEEE Journal of Solid-State Circuits, vol. 27, No. 3, (Mar. 1992), pp. 274-280.

* cited by examiner

*Primary Examiner*—Brian Sircus
*Assistant Examiner*—Dharti H. Patel
(74) *Attorney, Agent, or Firm*—Duane Morris LLP

(57) ABSTRACT

An eletrostatic discharge (ESD) protection circuit and method for operating same are disclosed. The protection circuit for each pad of integrated circuits include a diode string connected to a first pad at its anode end having a total forward voltage drop more than, or equal to, a first supply voltage and with its cathode end passing the ESD charge, a current dissipation module with at least one N-type MOSFET for passing the ESD charge from diode string to a first common node connectable to a second supply voltage, a first diode with its anode end connected to first common node and its cathode node connected to the first pad, and a control module for controlling the current dissipation module for dissipating the ESD charge through the first common node when it causes a voltage on the first pad to surpass the total forward voltage drop of the diode string.

23 Claims, 5 Drawing Sheets

SYSTEM AND METHOD FOR ESD PROTECTION ON HIGH VOLTAGE I/O CIRCUITS TRIGGERED BY A DIODE STRING

BACKGROUND OF INVENTION

The present invention relates generally to integrated circuit (IC) design, and more particularly to a method for protecting the core circuitry of an integrated circuit (IC) from damage that may be caused by electrostatic discharge (ESD).

A gate oxide of any metal-oxide-semiconductor (MOS) transistor, in an integrated circuit, is most susceptible to damage. The gate oxide may be destroyed by being contacted with a voltage only a few volts higher than supply voltage. It is understood that a regular supply voltage is 5.0, 3.3, 3.1 volts, or lower. Electrostatic voltages from common environmental sources can easily reach thousands, or even tens of thousands of volts. Such voltages are destructive even though the charge and any resulting current are extremely small. So, it is of critical importance to discharge any static electric charge, as it builds up, before it accumulates to a damaging voltage.

ESD is only a concern to an integrated circuit before it is installed into a larger circuit assembly, such as a printed circuit board (PCB), and before the PCB is connected to an operating power. This susceptible period includes production, storage, transport, handling, and installation. After the power is supplied, the power supplies and the structures can easily absorb or dissipate electrostatic charges.

ESD protection circuitry is typically added to ICs at the bond pads. The pads are the connections to the IC, to or from outside circuitry, for all electric power supplies, electric grounds, and electronic signals. Such added circuitry must allow normal operation of the IC. That means that the protection circuitry is effectively isolated from the normally operating core circuitry because it blocks current flow through itself to ground or any other circuit or pad. In an operating IC, electric power is supplied to a VCC pad, electric ground is supplied to a VSS pad, electronic signals are supplied from outside to some pads, and electronic signals generated by the core circuitry of the IC are supplied to other pads for delivery to external circuits and devices. In an isolated, unconnected IC, all pads are considered to be electrically floating, or of indeterminant voltage. In most cases, that means that the pads are at ground, or zero voltage.

ESD can arrive at any pad. This can happen, for embodiment, when a person touches some of the pads on the IC. This is the same static electricity that may be painfully experienced by a person who walks across a carpet on a dry day and then touches a grounded metal object. In an isolated IC, ESD acts as a brief power supply for one or more pads, while the other pads remain floating, or grounded. Because the other pads are grounded, when ESD acts as a power supply at a randomly selected pad, the protection circuitry acts differently than it does when the IC is operating normally. When an ESD event occurs, the protection circuitry must quickly become current conductive so that the electrostatic charge is conducted to VSS ground and thus dissipated before damaging voltage builds up.

ESD protection circuitry, therefore, has two states. In a normally operating IC, ESD protection circuitry appears invisible to the IC by blocking current through itself and, thus, having no effect on the IC. In an isolated, unconnected IC, ESD protection circuitry serves its purpose of protecting the IC by conducting an electrostatic charge quickly to VSS ground before a damaging voltage can build up.

What is always desirable is an improved ESD protection circuit.

SUMMARY

In view of the foregoing, this invention provides an eletrostatic discharge (ESD) protection circuit and the method for operating same. The protection circuit for each pad of an integrated circuit includes a diode string connected to a first pad at its anode end having a total forward voltage drop more than, or equal to, a first supply voltage; and with its cathode end passing the ESD charge, a current dissipation module with at least one N-type MOSFET for passing the ESD charge from the diode string to a first common node connectable to a second supply voltage, a first diode with its anode end connected to the first common node and its cathode node connected to the first pad, and a control module for controlling the current dissipation module for dissipating the ESD charge through the first common node when it causes a voltage on the first pad to surpass the total forward voltage drop of the diode string.

Various aspects and advantages will become apparent from the following detailed description, taken in conjunction with the accompanying drawings, illustrating the principles of the invention by way of embodiments.

DESCRIPTION

Figure 1A:
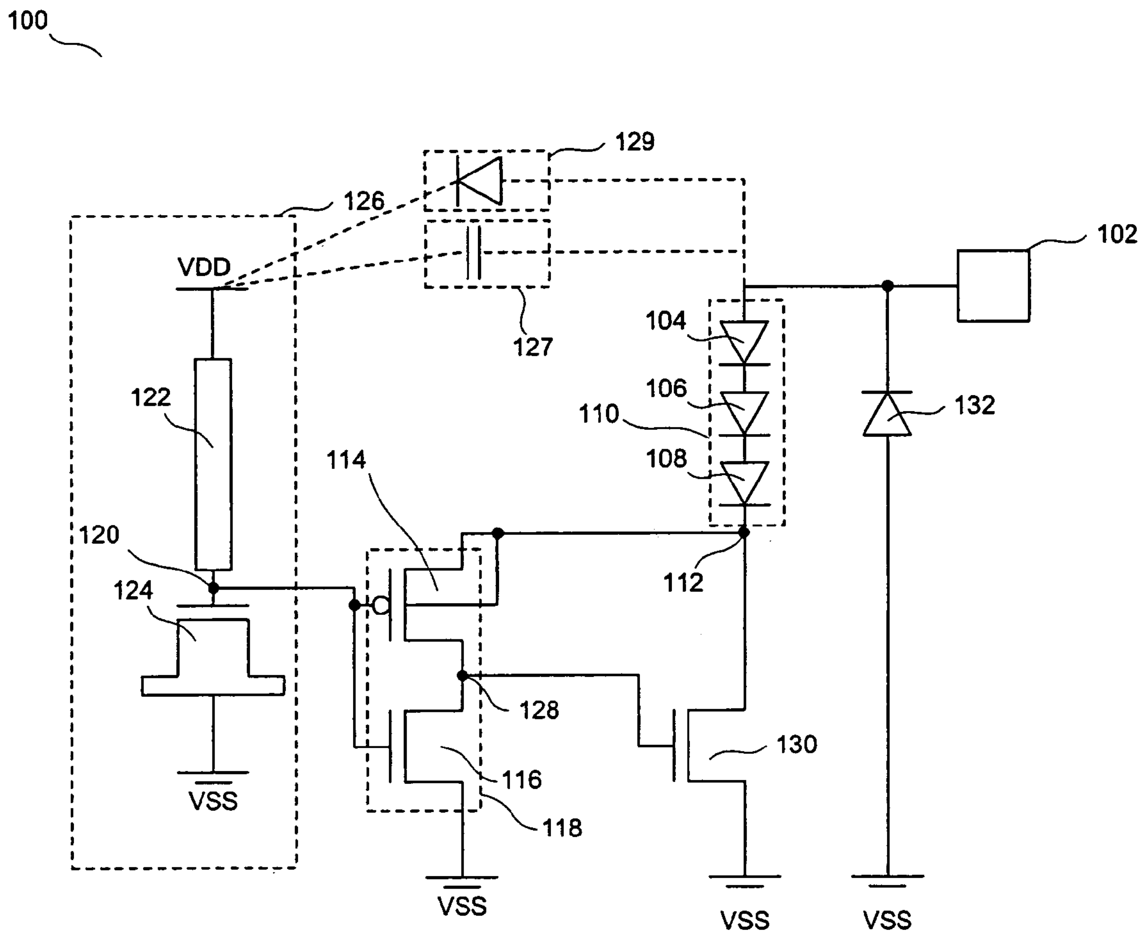
FIG. 1A illustrates an electrostatic discharge protection circuitry in accordance with a first embodiment of the present invention.

The present invention provides an improved method and system for electrostatic discharge protection. In a first embodiment, FIG. 1A illustrates an electrostatic discharge (ESD) protection circuitry 100 connected to a bondpad or pad 102 of an integrated circuit (IC). In operation, such a pad may be connected to a first external electric power supply VDD, a second external electric power supply VSS, an external electronic input signal source, or an internal electronic output signal source. Here, VDD is shown to be supplied internally from another source, and VSS is shown to be supplied internally to four locations from another source. In many situations, VSS is tied to ground.

Three diodes 104, 106, and 108 form a diode string 110, wherein the anode of diode 104 is connected to pad 102, the cathode of diode 104 is connected to the anode of diode 106, the cathode of diode 106 is connected to the anode of diode 108. Since the diodes 104, 106, and 108 are connected in series with their cathode and end pointing at the same direction, the diode string 110 is said to have a cathode end at node 112. Similarly, the diode string 110 has its anode end connecting to the pad 102. The cathode of diode 108 is connected to the node 112, which is connected to the body and the source of a P-channel metal-oxide-semiconductor field-effect-transistor (PMOSFET) 114. The gate of PMOSFET 114 is connected to the gate of N-channel metal-oxide-semiconductor field-effect-transistor (NMOSFET) 116. PMOSFET 114 and NMOSFET 116 form an inverter 118 with their two gates tied together at node 120. Node 120 is connected to one end of resistor 122, whose other end is connected to VDD. Node 120 is also connected to one end of an NMOS capacitor 124, whose other end is connected to VSS. The resistor 122 and the NMOS capacitor 124 effectively form a resistor-capacitor (RC) module 126. The drain of PMOSFET 114 is connected to the node 128, which is the output of the inverter 118 and connected to the gate of NMOSFET 130. Node 112 is also connected to the drain of NMOSFET 130. The source of NMOSFET 130 is connected to VSS. The source of NMOSFET 116 is connected to VSS. The drain of the NMOSFET 116 is connected to node 128. Pad 102 is also connected to the cathode of diode 132 whose anode is connected to VSS. It is understood that where the nodes are connected to various VSS nodes, they are all electrically connected to a common node. It is also noted that the RC module 126 and the inverter 118 can be viewed as a control module for turning on and off a current dissipation module such as the NMOSFET 130 during an ESD event.

In operation, pad 102 may be a pad for VDD, VSS, or an input or output that varies in a voltage range between VDD and VSS. Since the pad 102 voltage does not rise above VDD or fall below VSS, the diode string 110 and the diode 132 do not conduct because they are simply not biased. After the circuit is powered on, node 120 is charged to VDD and no current is flowing through resistor 122. So, voltage VDD is delivered to the gate of PMOSFET 114 and gate of NMOSFET 116 in the inverter 118. Therefore, a low voltage is delivered to the gate of NMOSFET 130, and NMOSFET 130 is always turned off.

The number of diodes in the diode string 110 is carefully chosen so that the sum of the forward voltage drops if all the diodes is just larger than VDD. Therefore, no normal signal from the pad reaches the node 112. In essence, the minimum number of diodes necessary for this value is selected so that the protection function will commence before any damage occurs. When in normal operation, NMOSFET 130 remains off at all times because it is designed to conduct electrostatic charges to VSS when challenged by a positive ESD. In normal operation, the low voltage at the gate of NMOSFET 130 holds it off, and the off state is further secured with no power provided from node 112. As such, the ESD protection circuitry is inert and has no effect on the normal operation of the integrated circuit (IC).

The IC is susceptible to ESD damage before it is installed into a larger circuit assembly, such as a printed circuit board PCB, and before the PCB is connected to operating power. This susceptible period includes production, storage, transport, handling, and installation operations. ESD protection circuitry is connected to each pad.

When a positive ESD arrives at a randomly selected pad such as pad 102, the ESD acts as a power supply applying positive voltage to that pad. The designed VSS connections are still at VSS. The designed VDD connection, at node 120, now begins at VSS and rises slowly with the resistor-capacitor (RC) time constant that depends on the values of resistor 122 and NMOS capacitor 124. If there is a large capacitor, as indicated by dotted line and capacitor symbol 127 in FIG. 1A, between a high voltage tolerant input/output pad 102 and VDD, then the large RC time constant of that capacitor in series with resistor 122 and NMOS capacitor 124 delays the rise of voltage at the node 120. If the capacitor 127 is small, then it only drops a small voltage and the voltage at node 120 is relatively much less impacted by the existence of such a small capacitance. The voltage at node 120 is likely to stay at VSS. Similarly, if there is a diode, as indicated by dotted line and diode symbol 129 in FIG. 1A, between pad 102 and VDD, then the voltage rise is delayed according to the RC time constant of resistor 122 and NMOS capacitor 124, and voltage rises slowly from VSS.

As the ESD arrives at pad 102 and the voltage suddenly begins to rise, current flows through the diode string 110 to node 112 when the voltage rises above the sum of the forward voltage drops of the diode string 110. That current begins to charge the drain of NMOSFET 130 and the source of PMOSFET 114. The gate of PMOSFET 114 and the gate of NMOSFET 116 begin at VSS in an unpowered IC, which drives the inverter 118 to deliver a relatively large or positive voltage from node 120 to the gate of NMOSFET 130. NMOSFET 130 therefore, turns on as power arrives at node 112 as its drain directs the current caused by the ESD to flow from pad 102 through the diode string 110 to VSS. As such, the voltage on pad 102 is clamped at a value above ground VSS that is the sum of the forward voltage drops of the three diodes 104,106, and 108 plus the voltage drop of the NMOSFET 130. The voltage drop of NMOSFET 130 is small when conducting, so the voltage on pad 102 remains just a little bit above the sum of the forward voltage drops of the diode string 110, which is safe for the core circuitry of the IC.

Figure 1B:
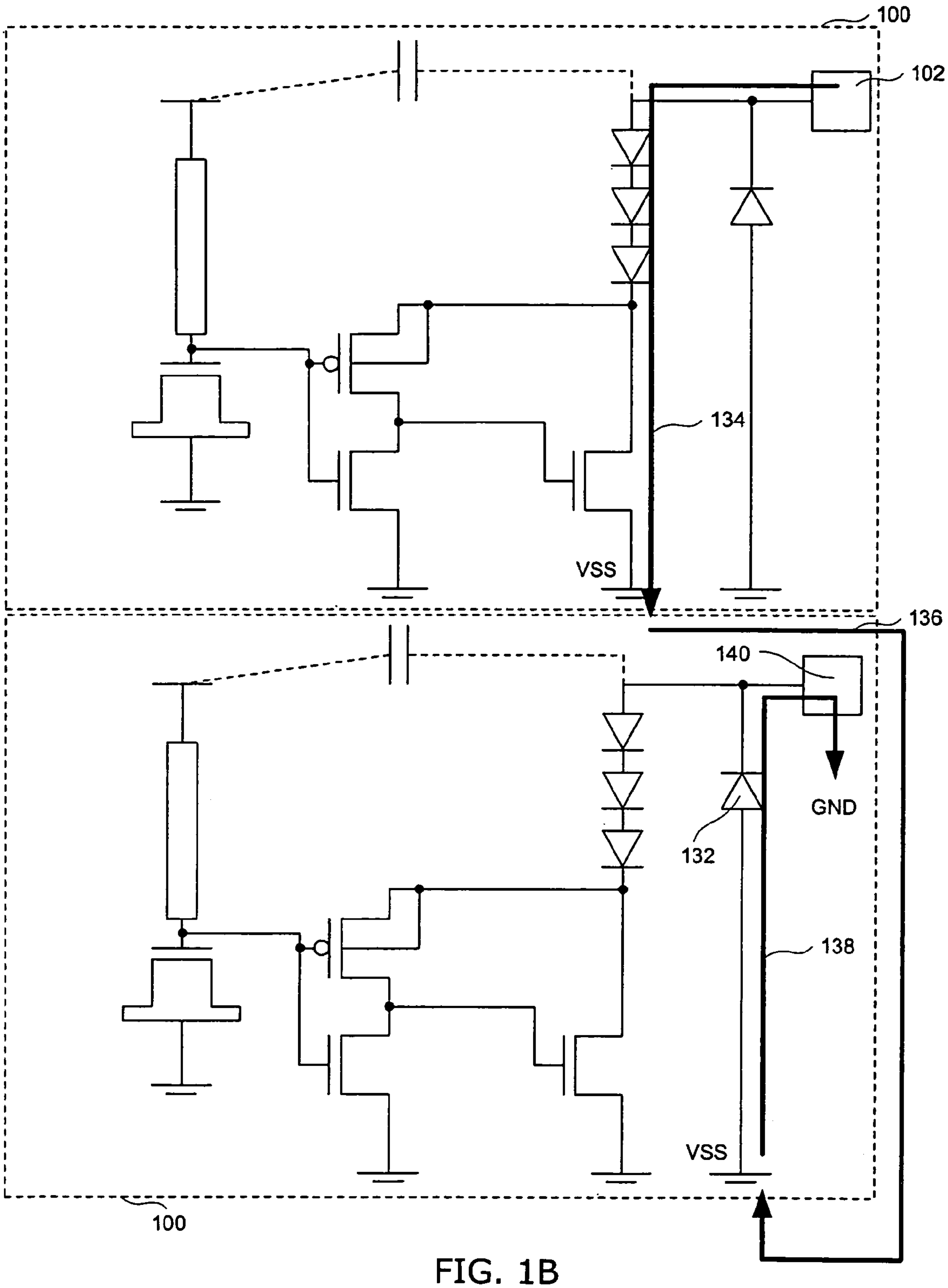
FIG. 1B illustrates an embodiment of current pathway during a positive electrostatic discharge event in accordance with the first embodiment of the present invention.

FIG. 1B illustrates a current pathway when a positive ESD arrives at the pad 102 in accordance with the first embodiment of the present invention. With reference to both FIGS. 1A and 1B, FIG. 1B includes two ESD protection circuits 100, the top circuit of which is zapped by a positive ESD. The pad of the bottom circuit is connected to ground. If the pad of the top circuit is not connected to ground, ESD charge is first dissipated to a VSS connection of the top circuit, as represented by a current pathway 134. Since the VSS connection of the top circuit is commonly connected, as represented by a common connection 136, to a VSS connection of the bottom circuit, whose pad 138 is connected to ground, ESD charge will travel from the VSS connection of the top circuit to the VSS of the bottom circuit. The ESD charge then travels through a pathway 140 via the diode 132 before it is finally dissipated to ground.

When a negative ESD arrives at a randomly selected pad 102, the negative voltage can only build up to the forward voltage drop of the diode 132. Negative static charge is dissipated at this low voltage to ground VSS through the diode 132. The core circuitry of the IC is easily protected. The ESD charge dissipates from pad 102 through diode 132 through VSS to ground.

Figure 2A:
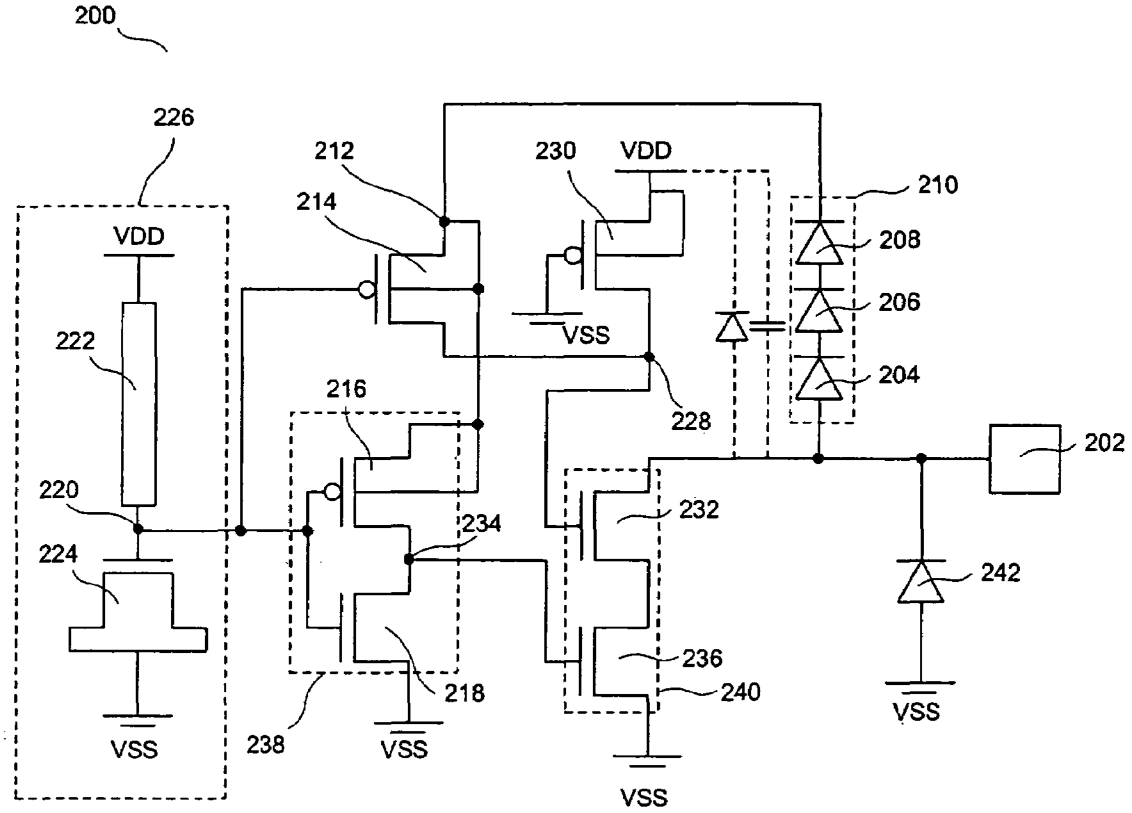
FIG. 2A illustrates an electrostatic discharge protection circuitry in accordance with a second embodiment of the present invention.

FIG. 2A illustrates an electrostatic discharge protection circuitry 200 connected to a pad 202 of an IC according to a second embodiment of the present invention. Here, VDD is shown to be supplied internally to two locations from another source, and VSS is shown to be supplied internally to five locations. Three diodes 204, 206, and 208 form a diode string 210, wherein the anode end of the diode string is connected to pad 202 and, the cathode end of the diode string 210 is connected to node 212. Node 212 is connected to the body and the source of a PMOSFET 214, and to the body and the source of PMOSFET 216. The gate of PMOSFET 214, the gate of PMOSFET 216, and the gate of NMOSFET 218 are connected to the node 220. Node 220 is connected to one end of the resistor 222, whose other end is connected to VDD. Node 220 is also connected to one end of an NMOS capacitor 224, whose other end is connected to VSS. The resistor 222 and the NMOS capacitor 224 form an RC module 226.

The drain of PMOSFET 214 is connected to the node 228, which is also connected to the drain of PMOSFET 230 and to the gate of NMOSFET 232. The gate of PMOSFET 230 is connected to VSS. The body and the source of PMOSFET 230 are connected to VDD. A node 234 is connected to the drain of PMOSFET. 216, to the drain of NMOSFET 218 and to the gate of NMOSFET 236. The source of NMOSFET 218 is connected to VSS. PMOSFET 216 and NMOSFET 218 form an inverter 238 that switches to NMOSFET 236. The drain of NMOSFET 232 is connected to the pad 202. The source of NMOSFET 232 is connected to the drain of NMOSFET 236. The source of NMOSFET 236 is connected to VSS. NMOSFETs 232 and 236 form an ESD dissipating module 240. Furthermore, the pad 202 is connected to the cathode of diode 242 with its anode connected to VSS. It is understood that PMOSFET 230 can be replaced by a functionally similar module such as a resistor or any switch module that provides a voltage higher than VSS to node 228. In fact, PMOSFET 230 is optional in the design as long as the gate of NMOSFET 232 is not overdriven. In some situations, the gate oxide of NMOSFET 232 is vulnerable to voltage stress during the voltage transition when the pad 202 moves from a low voltage to a much higher voltage level, and the damage done to it may degrade the life time of this device significantly. To protect the gate of NMOSFET 232, PMOSFET 230 is arranged to keep the gate of NMOSFET 232 at VDD level in this embodiment.

Further, the RC module 226 (or the RC module 126 in FIG. 1A) can also be replaced by any device that forms a RC delay for slowly charge node 220 (or the node 120 in FIG. 1A) to VDD. It is also noted that in this embodiment, the two transistors 232 and 236 are cascaded as a current dissipation module for dissipating the ESD charge, and the RC module 226, the inverter 238, and two PMOSFETs 214 and 230 can all be viewed as a control module to turn on and off the current dissipation module.

In normal operation, since the pad 202 voltage does not rise above VDD or fall below VSS, the diode string 210 and the diode 242 do not conduct. After the IC is powered up, node 220 is charged to VDD and no current is flowing through the resistor 222. So, voltage VDD is delivered to the gate of PMOSFET 214, the gate of PMOSFET 216 and the gate of NMOSFET 218. The voltage delivered to the input node of the inverter 238 causes a low voltage to appear at the node 234, which is subsequently delivered to the gate of NMOSFET 236, thereby turning NMOSFET 236 off.

Since the source and the gate of PMOSFET 230 is connected to VDD and VSS, respectively, VDD appears at node 228, which connects to the gate of NMOSFET 232 and the drain of PMOSFET 214. Moreover, VDD at the gate of PMOSFET 214 always holds it off and the lack of power at the source of PMOSFET 214 enhances the off mode. The result is that this ESD protection circuit is inert and has no effect on the operation of the IC. If the pad 202 is a high voltage tolerant input/output pad, a voltage higher than VDD may be imposed. The voltage across the pad 202 and node 228 (or gate-to-drain voltage of transistor 232) is still lower than VDD since transistor 230 has "pulled" node 228 to VDD. As such, the ESD protection circuit 200 is protected from high voltage imposed on pad 202.

When a positive ESD arrives at pad 202, the ESD acts as a power supply applying a high positive voltage to that pad. Current flows through the string of diodes 204, 206, and 208 to the source and the body of PMOSFET 214, and to the source and the body of PMOSFET 216, as the voltage rises above the sum of the forward voltage drops of the diode string 210. Node 220 begins at VSS and rises slowly, depending on the values of resistor 222 and NMOS capacitor 224. If there is a large capacitor existing for a high voltage input/output pad, as indicated with a dotted line in FIG. 2A, between pad 202 and VDD, then the large RC time constant of that capacitor in series with resistor 222 and NMOS capacitor 224 delays the rise of voltage at the node 220. If pad 202 is just a normal input/output pad, there may be a diode, as indicated with a dotted line in FIG. 2A, between pad 202 and VDD, then the voltage rise is delayed according to the RC time constant of resistor 222 and NMOS capacitor 224, and the voltage rises slowly from VSS to a value smaller than VDD by the voltage drop across the diode. The low voltage at node 220 turns on PMOSFET 214 to pull node 228 to VDD as PMOSFET 230 is always on, thereby turning on PMOSFET 232. Simultaneously, the low voltage at node 220 also becomes the input to the inverter 238, thereby producing a high voltage at node 234, which in turn imposes a high voltage at the gate of NMOSFET 236 to turn it on.

At this moment, all the transistors are turned on, and both NMOSFETs 232 and 236 conduct. The ESD charge on pad 202 delivers a current through the diode string 210, through the conducting PMOSFET 214 to node 228, and further through transistors 232 and 236 to VSS. Similar to the first embodiment, the pad 202 is clamped at a voltage just above VDD, which is safe for the core circuitry of the IC. The function of ESD protection is thus achieved.

Figure 2B:
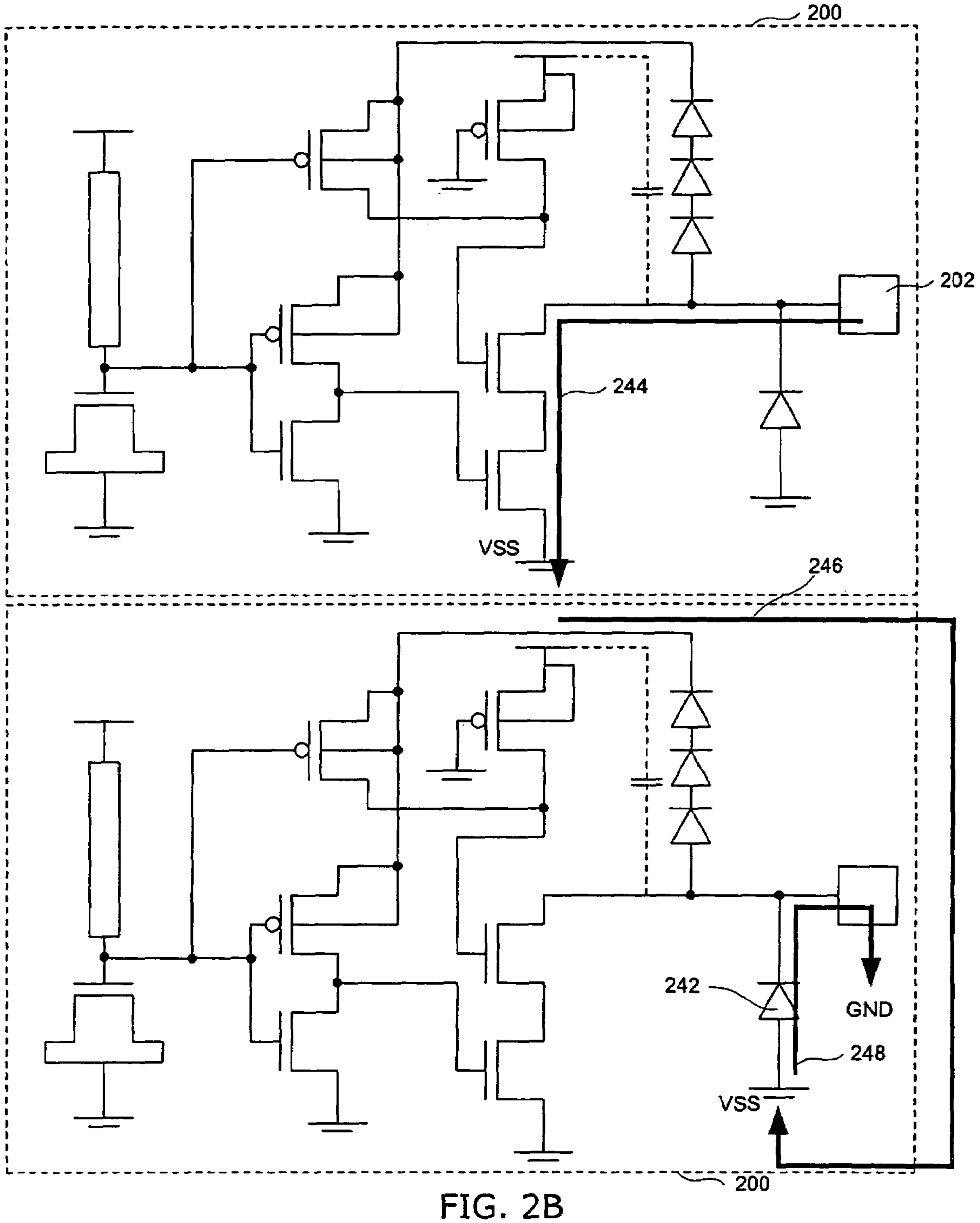
FIG. 2B illustrates an embodiment of current pathway during a positive electrostatic discharge event in accordance with the second embodiment of the present invention.

FIG. 2B illustrates an electric current pathway when a positive ESD arrives at the pad 202 in accordance with the second embodiment of the present invention. Two ESD protection circuits 200 are shown, with the top circuit being "zapped" by a positive ESD. The pad of the bottom circuit is connected to ground. If the pad of the top circuit is not connected to ground, the ESD charge is first dissipated to a VSS connection of the top circuit, as represented by a pathway 244. Since the VSS connection of the top circuit is commonly connected, as represented by a common connection 246, to a VSS connection of the bottom circuit whose pad is connected to ground, the ESD charge will travel from the VSS of the top circuit to the VSS of the bottom circuit. The ESD charge then travels through a pathway 248 via the diode 242 before it is finally dissipated to ground.

When a negative ESD arrives at pad 202, the negative voltage can only build up to the forward voltage drop of the diode 242. Negative static charge is dissipated at this low voltage to ground VSS through the diode 242. The core circuitry of the IC is easily protected. The ESD charge dissipates from pad 202 through diode 242 to VSS, and then is grounded.

Figure 3:
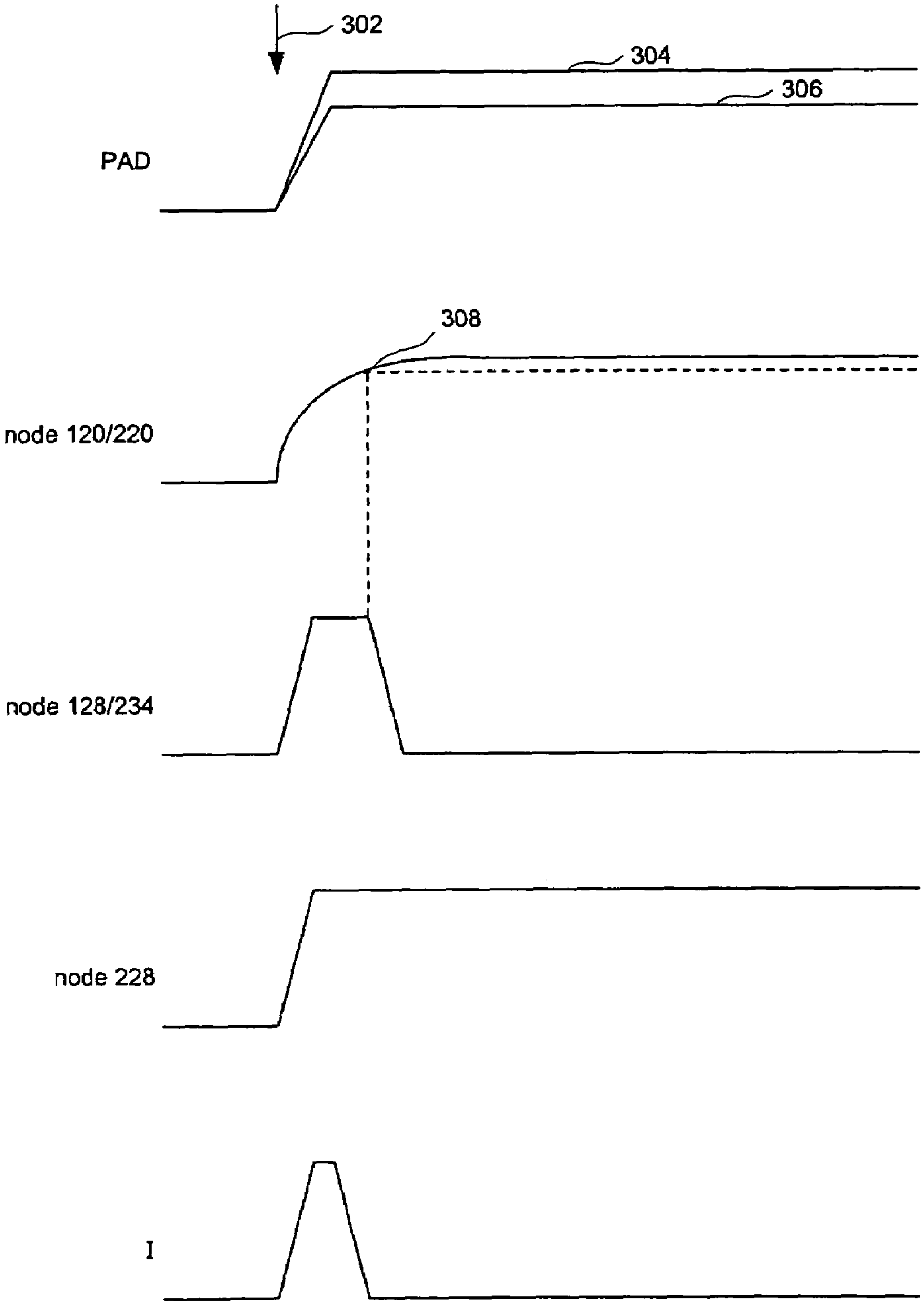
FIG. 3 illustrates a timing diagram for various nodes of the ESD protection circuitry during a positive electrostatic discharge event in accordance with the first and the second embodiments of the present invention.

FIG. 3 illustrates the timing curves of various nodes in the circuits demonstrated by both FIGS. 1A and 2A. At the onset of a positive ESD event 302. the voltage rise on pad 102 or 202, is represented by a curve 304. The voltage is clamped or limited just above VDD. A curve 306 shows the voltage at node 112 or 212. This voltage is clamped at a lower level by the diode string 110 or 210. The voltage at node 120 or 220 rises according to the RC time constant of the RC module 126 or 226. When this voltage is below a threshold voltage 308, the inverter switches and controls NMOSFET 130 or NMOSFET 236. The voltage curve for node 128 or 234 shows the behavior of the output of the inverter. For the circuit in FIG. 2A, the voltage curve for node 228 goes high to control NMOSFET 232. These NMOSFETs are the devices designed to conduct and dissipate the ESD charge to ground VSS. The last curve on the timing diagram shows the current from the pad 102 or pad 202 to VSS. The current is shown beginning at the onset of the ESD event 302 and completing the dissipation of the charge before NMOSFET 130 or NMOSFET 236 is shut off again in preparation for normal operation.

Once the voltage at node 120 or 220 increases above the threshold, the inverter switches, which turns off the ESD dissipating NMOSFET(s). The ESD event is over and the charge has been dissipated.

The above invention provides many different embodiments, or embodiments, for implementing different features of the invention. Specific embodiments of component, and processes are described to help clarify the invention. These are, of course, merely embodiments, and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. An electrostatic discharge (ESD) protection circuit for an integrated circuit comprising:

a diode string connected to a first pad at its anode end having a total forward voltage drop more than or equal to a first supply voltage and with its cathode end passing the ESD charge;

a current dissipation module with at least one N-type MOSFET for passing the ESD charge from the diode string to a first common node connectable to a second supply voltage;

a first diode with its anode end connected to the first common node and its cathode node connected to the first pad; and a control module for controlling the current dissipation module for dissipating the ESD charge through the first common node when it causes a voltage on the first pad to surpass the total forward voltage drop of the diode string, wherein when the first common node is not connected to ground, the ESD charge on the first pad is dissipated through the first common node to ground via a second diode similarly situated as the first diode with regard to a second pad wherein the second pad is connected to ground.

2. The circuit of claim 1 wherein the control module further includes:

an inverter module for controlling the gate of the MOSFET; and a resistor-capacitor (RC) module providing an input voltage to the inverter module during a predetermined charging process thereof when the ESD charge arrives so that an output of the inverter module turns on the MOSFET for dissipating the ESD charge.

3. The circuit of claim 2 wherein the cathode end of the diode string provides a predetermined voltage to the inverter module for powering the inverter module.

4. The circuit of claim 2 wherein die RC module further includes a resistor and a N-type transistor combination with the resistor connected to the gate of the N-type transistor.

5. The circuit of claim 1 wherein the current dissipation module further includes a first and second N-type MOSFETs cascaded in a series wherein the drain of the first MOSFET is connected to the first pad and the source of the second MOSFET is connected to the first common node.

6. The circuit of claim 5 wherein the control module further includes:

a switch module for controlling the gate of the first N-type MOSFET;

an inverter module for controlling the gate of the second N-type MOSFET; and a resistor-capacitor (RC) module providing an input voltage to the inverter module during a predetermined charging process when the ESD charge arrives, wherein during a predetermined charging process, the switch module turns on the first N-type MOSFET and the inverter module turns on the second N-type MOSFET for dissipating the ESD charge.

7. The circuit of claim 6 wherein the switch module further includes a first P-type MOSFET with its gate controlled by the input voltage provided by the RC module and its drain controlling the gate of the first N-type MOSFET.

8. The circuit of claim 7 wherein the switch module further includes a second P-type MOSFET for passing the first supply voltage to the gate of first N-type MOSFET to be about the first supply voltage during the predetermined charging process.

9. An electrostatic discharge (ESD) protection circuit for an integrated circuit comprising:

a diode string connected to a first pad at its anode end having a total forward voltage drop more than or equal to a first supply voltage and with its cathode end passing the ESD charge;

a current dissipation module with at least one N-type MOSFET for passing the ESD charge from the diode string to a first common node connectable to a second supply voltage;

a first diode with its anode end connected to the first common node and its cathode node connected to the first pad; and a control module for controlling the current dissipation module for dissipating the ESD charge when it causes a voltage on the first pad to surpass the total forward voltage drop of the diode sting, wherein a resistor-capacitor (RC) module provides an input voltage to the control module during a predetermined charging process thereof when the ESD charge arrives so that an output of the control module turns on the N-type MOSFET for dissipating the ESD charge, wherein when the first common node is not connected to ground, the ESD charge on the first pad is dissipated through the first common node to ground via a second diode similarly situated as the first diode with regard to a second pad wherein the second pad is connected to ground.

10. The circuit of claim 9 wherein the control module further includes an inverter module for controlling the gate of the MOSFET.

11. The circuit of claim 9 wherein the cathode end of the diode string provides a predetermined voltage to the control module for powering the control module.

12. The circuit of claim 11 wherein the RC module further includes a resistor and a N-type transistor capacitor combination with the resistor connected to the gate of the N-type transistor.

13. The circuit of claim 11 wherein the current dissipation module further includes a first and second N-type MOSFETs cascaded in a series wherein the drain of the first MOSFET is connected to the first pad and the source of the second MOSFET is connected to the first common node.

14. The circuit of claim 13 wherein the control module further includes:

a switch module for controlling the gate of the first N-type MOSFET; and an inverter module for controlling the gate of the second N-type MOSFET, wherein during the predetermined charging process, the switch module turns on the first N-type MOSFET and the inverter module turns on the second N-type MOSFET for dissipating the ESD charge.

15. The circuit of claim 14 wherein the switch module further includes a first P-type MOSFET with its gate controlled by the input voltage provided by the RC module and its drain controlling the gate of the first N-type MOSFET.

16. The circuit of claim 15 wherein the switch module further includes a second P-type MOSFET for passing the first supply voltage to the gate of the first N-type MOSFET to be about the first supply voltage during the predetermined charging process.

17. A method for dissipating an electrostatic discharge (ESD) charge on a pad of an integrated circuit using an ESD protection circuit, the ESD protection circuit having a diode string connected to a first pad at its anode end having a total forward voltage drop more than or equal to a first supply voltage, and a first diode with its anode end connected to a first common node and its cathode node connected to the first pad, the method comprising:

receiving an ESD charge on a first pad; and controlling a current dissipation module with at least one N-type MOSFET contained therein using a control module for passing the ESD charge from the diode string through the first common node when the ESD charge causes a voltage on the first pad to surpass the total forward voltage drop of the diode string, wherein when the first common node is not connected to ground, the method further comprising dissipating the ESD charge on the first pad through the first common node to ground via a second diode similarly situated as the first diode with regard to a second pad wherein the second pad is connected to ground.

18. The method of claim 17 wherein the controlling further includes charging a resistor-capacitor (RC) module for providing an input voltage to the control module during a predetermined charging process when the ESD charge arrives on the first pad so that an output of the control module turns on the N-type MOSFET for dissipating the ESD charge.

19. The method of claim 17 wherein the controlling further includes, if the current dissipation module further includes a first and second N-type MOSFETs cascaded in series with the drain of the first MOSFET connected to the first pad and the source of the second MOSFET connected to the first common node, using a switch module for turning on the first N-type MOSFET and using a resistor-capacitor (RC) module for providing an input voltage to an inverter module dining a predetermined charging process when the ESD charge arrives for turning on the second N-type MOSFET for dissipating the ESD charge.

20. The method of claim 19 wherein the switch module further includes:

a first P-type MOSFET with its gate controlled by the input voltage provided by the RC module and its drain controlling the gate of the first N-type MOSFET; and a second P-type MOSFET for passing the first supply voltage to the gate of the first N-type MOSFET to be about the first supply voltage during the predetermined charging process.

21. An electrostatic discharge (ESD) protection circuit for an integrated circuit comprising:

a diode string connected to a first pad at its anode end having a total forward voltage drop more than or equal to a first supply voltage and with its cathode end passing the ESD charge;

a current dissipation module with at least one N-type MOSFET for passing the ESD charge from the diode string to a first common node connectable to a second supply voltage;

a first diode with its anode end connected to the first common node and its cathode node connected to the first pad; and a control module for controlling the current dissipation module for dissipating the ESD charge through the first common node when it causes a voltage on the first pad to surpass the total forward voltage drop of the diode string, wherein the current dissipation module includes a first and second N-type MOSFETs cascaded in a series wherein the drain of the first MOSFET is connected to the first pad and the source of the second MOSFET is connected to the first common node, wherein the control module includes:

a switch module for controlling the gate of the first N-type MOSFET;

an inverter module for controlling the gate of the second N-type MOSFET; and a resistor-capacitor (RC) module providing an input voltage to the inverter module during a predetermined charging process when the ESD charge arrives, wherein during a predetermined charging process, the switch module turns on the first N-type MOSFET and the inverter module turns on the second N-type MOSFET for dissipating the ESD charge, and wherein the switch module includes:

a first P-type MOSFET with its gate controlled by the input voltage provided by the RC module and its drain controlling the gate of the first N-type MOSFET; and a second P-type MOSFET for passing the first supply voltage to the gate of first N-type MOSFET to be about the first supply voltage during the predetermined charging process.

22. An electrostatic discharge (ESD) protection circuit for an integrated circuit comprising:

a diode string connected to a first pad at its anode end having a total forward voltage drop more than or equal to a first supply voltage and with its cathode end passing the ESD charge;

a current dissipation module with at least one N-type MOSFET for passing the ESD charge from the diode string to a first common node connectable to a second supply voltage;

a first diode with its anode end connected to the first common node and its cathode node connected to the first pad; and a control module for controlling the current dissipation module for dissipating the ESD charge when it causes a voltage on the first pad to surpass the total forward voltage drop of the diode string, wherein a resistor-capacitor (RC) module provides an input voltage to the control module during a predetermined charging process thereof when the ESD charge arrives so that an output of the control module turns on the N-type MOSFET for dissipating the ESD charge, wherein the cathode end of the diode string provides a predetermined voltage to the control module for powering the control module, wherein the current dissipation module further includes a first and second N-type MOSFETs cascaded in a series wherein the drain of the first MOSFET is connected to the first pad and the source of the second MOSFET is connected to the first common node, wherein the control module includes:

a switch module for controlling the gate of the first N-type MOSFET; and an inverter module for controlling the gate of the second N-type MOSFET, wherein during the predetermined charging process, the switch module turns on the first N-type MOSFET and the inverter module turns on the second N-type MOSFET for dissipating the ESD charge, and wherein the switch module includes:

a first P-type MOSFET with its gate controlled by the input voltage provided by the RC module and its drain controlling the gate of the first N-type MOSFET; and a second P-type MOSFET for passing the first supply voltage to the gate of the first N-type MOSFET to be about the first supply voltage during the predetermined charging process.

23. A method for dissipating an electrostatic discharge (ESD) charge on a pad of an integrated circuit using an ESD protection circuit, the ESD protection circuit having a diode string connected to a first pad at its anode end having a total forward voltage drop more than or equal to a first supply voltage, and a first diode with its anode end connected to a first common node and its cathode node connected to the first pad, the method comprising:

receiving an ESD charge on a first pad; and controlling a current dissipation module with at least one N-type MOSFET contained therein using a control module for passing the ESD charge from the diode string through the first common node when the ESD charge causes a voltage on the first pad to surpass the total forward voltage drop of the diode string, wherein the controlling further includes, if the current dissipation module further includes a first and second N-type MOSFETs cascaded in series with the drain of the first MOSFET connected to the first pad and the source of the second MOSFET connected to the first common node, using a switch module for turning on the first N-type MOSFET and using a resistor-capacitor (RC) module for providing an input voltage to an inverter module during a predetermined charging process when the ESD charge arrives for turning on the second N-type MOSFET for dissipating the ESD charge, and wherein the switch module includes:

a first P-type MOSFET with its gate controlled by the input voltage provided by the RC module and its drain controlling the gate of the first N-type MOSFET; and a second P-type MOSFET for passing the first supply voltage to the gate of the first N-type MOSFET to be about the first supply voltage during the predetermined charging process.

* * * * *

UNITED STATES PATENT AND TRADEMARK OFFICE

CERTIFICATE OF CORRECTION

PATENT NO. : 7,061,737 B2 Page 1 of 1
APPLICATION NO. : 10/818052
DATED : June 13, 2006
INVENTOR(S) : Chung-Hui Chen It is certified that error appears in the above-identified patent and that said Letters Patent is hereby corrected as shown below:

Column 8, line 1, delete "die" and insert therefor --the--;

Column 8, line 49, delete "sting" and insert therefor --string--; and

Column 9, line 65, delete "dining" and insert therefor --during--.

Signed and Sealed this

Tenth Day of April, 2007

JON W. DUDAS
*Director of the United States Patent and Trademark Office*